(12) United States Patent
Findeklee et al.

(10) Patent No.: US 11,372,064 B2
(45) Date of Patent: Jun. 28, 2022

(54) MAGNETIC RESONANCE RECEIVE COIL WITH DETUNE CIRCUIT AND ENERGY HARVESTING CIRCUIT

(71) Applicant: KONINKLIJKE PHILIPS N.V., Eindhoven (NL)

(72) Inventors: Christian Findeklee, Norderstedt (DE); Oliver Lips, Hamburg (DE)

(73) Assignee: Koninklijke Philips N.V., Eindhoven (NL)

( * ) Notice: Subject to any disclaimer, the term of this patent is extended or adjusted under 35 U.S.C. 154(b) by 216 days.

(21) Appl. No.: 16/564,011

(22) Filed: Sep. 9, 2019

(65) Prior Publication Data

US 2020/0096583 A1 Mar. 26, 2020

(30) Foreign Application Priority Data

Sep. 11, 2018 (EP) .................................... 18193582

(51) Int. Cl.
*G01R 33/36* (2006.01)
*H02J 50/12* (2016.01)
*H02J 7/02* (2016.01)

(52) U.S. Cl.
CPC .......... *G01R 33/3607* (2013.01); *H02J 7/025* (2013.01); *H02J 50/12* (2016.02)

(58) Field of Classification Search
CPC ............ G01R 33/3607; G01R 33/3628; G01R 33/3657; G01R 33/3692; H02J 7/025; H02J 50/12
See application file for complete search history.

(56) References Cited

U.S. PATENT DOCUMENTS

| 7,973,531 B2 | 7/2011 | Findeklee | |
| 2010/0060283 A1* | 3/2010 | Findeklee | ........... G01R 33/3453 324/318 |

(Continued)

Primary Examiner — Steven L Yeninas

(57) ABSTRACT

The invention relates to a magnetic resonance receive coil including a resonator for use in a magnetic resonance imaging system. The radio frequency receive coil according to the invention comprises a first conducting element of the resonator having a conductive loop wherein the received signal is induced in that loop, configured to form a primary resonant circuit tunable to at least one first resonance frequency and a second conducting element of the resonator configured to form an electric circuit electrically insulated from and reactively coupled to the primary resonant circuit, the electric circuit being adapted to detune the primary resonant circuit to at least one second resonance frequency. The second conducting element of the resonator has a conductive loop with a pair of ends connected to a preamplifier. The radio frequency receive coil further comprises an energy harvesting circuit electrically coupled in parallel over the pair of ends of the second conducting element, wherein the energy harvesting circuit is adapted for being connected to the second conducting element during transmission by a switch. A rechargeable power source is coupled to the energy harvesting circuit, wherein the rechargeable power source is adapted for being charged by the energy harvesting circuit. A switching component is circuited in parallel to the energy harvesting circuit, wherein is adapted to redirect a current as soon as the rechargeable power source is charged to a sufficient voltage. In this way, a magnetic resonance receive coil with a detune circuit and an energy harvesting circuit for energy harvesting is provided without a significant loss of detuning performance.

12 Claims, 2 Drawing Sheets

(56) References Cited

U.S. PATENT DOCUMENTS

| | | |
|---|---|---|
| 2014/0002085 A1 | 1/2014 | Biber et al. |
| 2014/0070808 A1* | 3/2014 | Reykowski ........ G01R 33/3657 |
| | | 324/309 |
| 2014/0163355 A1 | 6/2014 | Kurpad et al. |
| 2014/0218035 A1 | 8/2014 | Okamoto |
| 2014/0225613 A1* | 8/2014 | Reykowski ............ G01R 33/36 |
| | | 324/309 |
| 2017/0160356 A1 | 6/2017 | Liu |
| 2017/0176551 A1 | 6/2017 | Deunsing et al. |
| 2017/0307700 A1* | 10/2017 | Hu ................... G01R 33/34084 |
| 2017/0336484 A1* | 11/2017 | Fuderer ............. G01R 33/3692 |
| 2018/0055406 A1* | 3/2018 | Mandal ............. A61N 1/36025 |
| 2019/0265317 A1 | 8/2019 | Ortiz et al. |

* cited by examiner

MAGNETIC RESONANCE RECEIVE COIL WITH DETUNE CIRCUIT AND ENERGY HARVESTING CIRCUIT

FIELD OF THE INVENTION

The invention relates to the field of magnetic resonance devices, and in particular to magnetic resonance devices with a magnetic resonance receive coil with a detune circuit and an energy harvesting circuit.

BACKGROUND OF THE INVENTION

Magnetic resonance methods, which utilize interaction between magnetic field and nuclear spins in order to form two-dimensional or three-dimensional images, are widely used nowadays, notably in the field of medical diagnostics.

Usually, magnetic resonance imaging (MRI) systems comprise a superconducting main magnet for the generation of static B0-field in an examination zone, gradient coils for the generation of switched magnetic field gradients during the imaging sequence, and a radio frequency coil assembly. The radio frequency coil assembly of known MRI systems includes a transmit coil to generate B1-field for excitation of nuclear spins, and one or more receiving antennas used in conjunction with the transmit coil to detect and receive the magnetic resonance signals. Typically, the receiving antennas of the radio frequency coil assembly are connected to a remote receiver system via a bundle of coaxial cables and wires with bazooka baluns. Additionally, the receiving antennas of the radio frequency coil assembly are supplied power via a series of DC cables.

It is believed that the cabling between MRI receiving antennas and the remote receiver system can be replaced by wireless transmission of the received MRI signals. Furthermore, a rechargeable battery or a capacitor can be incorporated in MRI devices in place of the DC cables. In order to keep the battery/capacitor charged, the radio frequency energy generated by the transmit coils can be picked up by a pick-up coil operating at the same resonance frequency as the MRI signals. The radio frequency energy is further rectified to provide the necessary power for battery/capacitor charging. Such wireless power scheme will result in B1-field inhomogeneity due to pick-up coil interference. As a consequence of B1-field inhomogeneity, the image quality will degrade.

The idea of using the transmit B1 residual current in a detuned receiving coil for energy harvesting is quite challenging because the detune circuit must be efficient enough such that the coil is still switching off efficiently. Therefore, the detuning of the receiving antennas of the radio frequency coil assembly is an important aspect.

Detuning of a radio frequency coil refers to the practice of shifting the resonance frequency of a primary resonant circuit to one or more other frequencies different from the original frequency. In the ways of detuning mentioned in the prior art, the radio frequency receiver circuit and the detuning circuit are electrically connected. In contrast, for the kind of detuning circuit disclosed herein, the radio frequency receiver and the detuning circuits are separated, with no direct (galvanic) electrical interconnection between the two. Instead, the proposed device uses a strong reactive coupling between the two circuits to effect the detuning of the radio frequency receiver circuit.

WO 2016/001180 A1 by Young Liu discloses a MR receive coil with a detune circuit and an energy harvesting circuit. The detune circuit is coupled to the receiving antenna for switching the receiving antenna between a resonant mode and a non-resonant mode.

In matching and detuning circuits, inductive elements are demanded to generate resonances for forming low or high impedances. These inductive elements typically dominate the losses in the structure. Furthermore, a low loss inductor for very efficient detuning or matching needs much space.

SUMMARY OF THE INVENTION

It is an object of the invention to provide a magnetic resonance receive coil with a detune circuit and an energy harvesting circuit for energy harvesting without a significant loss of detuning performance and which does not demand additional space and still has low losses in the operating (receiving) state.

According to the invention, this object is addressed by the subject matter of the independent claims. Preferred embodiments of the invention are described in the sub claims.

Therefore, according to the invention, a radio frequency receive coil including a resonator for use in a magnetic resonance imaging system is provided, the receive coil comprising: a first conducting element of the resonator having a conductive loop wherein the received signal is induced in that loop, configured to form a primary resonant circuit tunable to at least one first resonance frequency; a second conducting element of the resonator configured to form an electric circuit electrically insulated from and reactively coupled to the primary resonant circuit, the electric circuit being adapted to detune the primary resonant circuit to at least one second resonance frequency; the second conducting element of the resonator having a conductive loop with a pair of ends wherein a preamplifier is connected in series with one of the ends; an energy harvesting circuit electrically coupled in parallel over the pair of ends of the second conducting element, wherein the energy harvesting circuit is adapted for being connected to the second conducting element during transmission by a switch; a rechargeable power source coupled to the energy harvesting circuit, wherein the rechargeable power source is adapted for being charged by the energy harvesting circuit, and a pin-diode (or similar switching component, e.g. a combination with a Zener diode) circuited in parallel to the energy harvesting circuit, wherein the pin-diode is adapted to redirect a current as soon as the rechargeable power source is charged to a sufficient voltage. The second conducting element is switchable reactively coupled to the primary resonant circuit. That is, the second conducting element may be switched by way of a switching component to be reactively coupled to the primary resonant circuit to detune the primary resonant circuit. In a practical implementation, the switching component may be activated for both ensuring detuning of the primary resonant circuit as well as to activate the energy harvesting circuit.

The proposed concept ensures that the charging state of the rechargeable power source does not influence the radio frequency properties of the receive coil. The simple structure of the detuning and energy harvesting arrangement makes it easy to manufacture. The invention utilizes the coil loop itself for detuning and matching which therefore does not demand additional space. In combination with an energy harvesting circuit, power can be efficiently transferred to the radio frequency receive coil. The invention works more efficiently than other coupled detune circuits, which e.g. apply dedicated transformers.

According to one embodiment of the present invention, the energy harvesting circuit further comprises a rectifier, wherein the rectifier is adapted to charge the rechargeable power source. The rectifier generates a direct current for use as a source of power and to charge the rechargeable power source.

According to one embodiment of the present invention, the resonator is a transmission cable. Preferably, the transmission cable is a coaxial cable. Further, it is preferred that the first conducting element is an outer shield of the coaxial cable, and the second conducting element is an inner core of the coaxial cable. To use a coaxial cable to form the resonator of the radio frequency receive coil is a simple and elegant solution and the coaxial design ensures that a high degree of mechanical flexibility is possible with the magnetic resonance receive coil.

According to one embodiment of the present invention, the resonator consists of two or more transmission cables.

The invention also relates to a method for energy harvesting for a radio frequency receive coil including a resonator for use in a magnetic resonance imaging system, the energy harvesting method comprising: receiving a magnetic resonance signal of a magnetic resonant examination by a first conducting element of the resonator having a conductive loop wherein the received signal is induced in that loop, wherein the first conducting element is configured to form a primary resonant circuit tunable to at least one first resonance frequency; detuning the first conducting element by a second conducting element of the resonator, wherein the second conducting element is configured to form an electric circuit electrically insulated from and reactively coupled to the primary resonant circuit, the electric circuit being adapted to detune the primary resonant circuit to at least one second resonance frequency, wherein the second conducting element of the resonator having a conductive loop with a pair of ends; switching a harvesting circuit in parallel at the pair of ends of the second conducting element; harvesting electric energy from the first conducting element by inducing electric energy from the first conducting element to the second conducting element, and passing the current to the harvesting circuit by the second conducting element.

According to one embodiment of the present invention, the method further comprises: charging a rechargeable power source by the induced harvesting current with a rectifier.

The invention also relates to a magnetic resonance system, comprising a radio frequency receive coil described above. The radio frequency receive coil according to the invention improves the performance of the magnetic resonance system as a whole.

The invention also relates to a computer program product, comprising instructions to cause the magnetic resonance system to execute the steps of the method described above. Some aspects of this invention, such as the control of the detuning and control of the charging of the battery may also be implemented in the form of software, notably in the form of software packages that upgrade already installed software to enable installed magnetic resonance imaging system to also operate according to the present invention.

BRIEF DESCRIPTION OF THE DRAWINGS

These and other aspects of the invention will be apparent from and elucidated with reference to the embodiments described hereinafter. Such an embodiment does not necessarily represent the full scope of the invention, however, and reference is made therefore to the claims and herein for interpreting the scope of the invention.

In the drawings.

DETAILED DESCRIPTION OF EMBODIMENTS

Detailed description of the present invention is given below in connection with the accompanying drawings.

Figure 1:
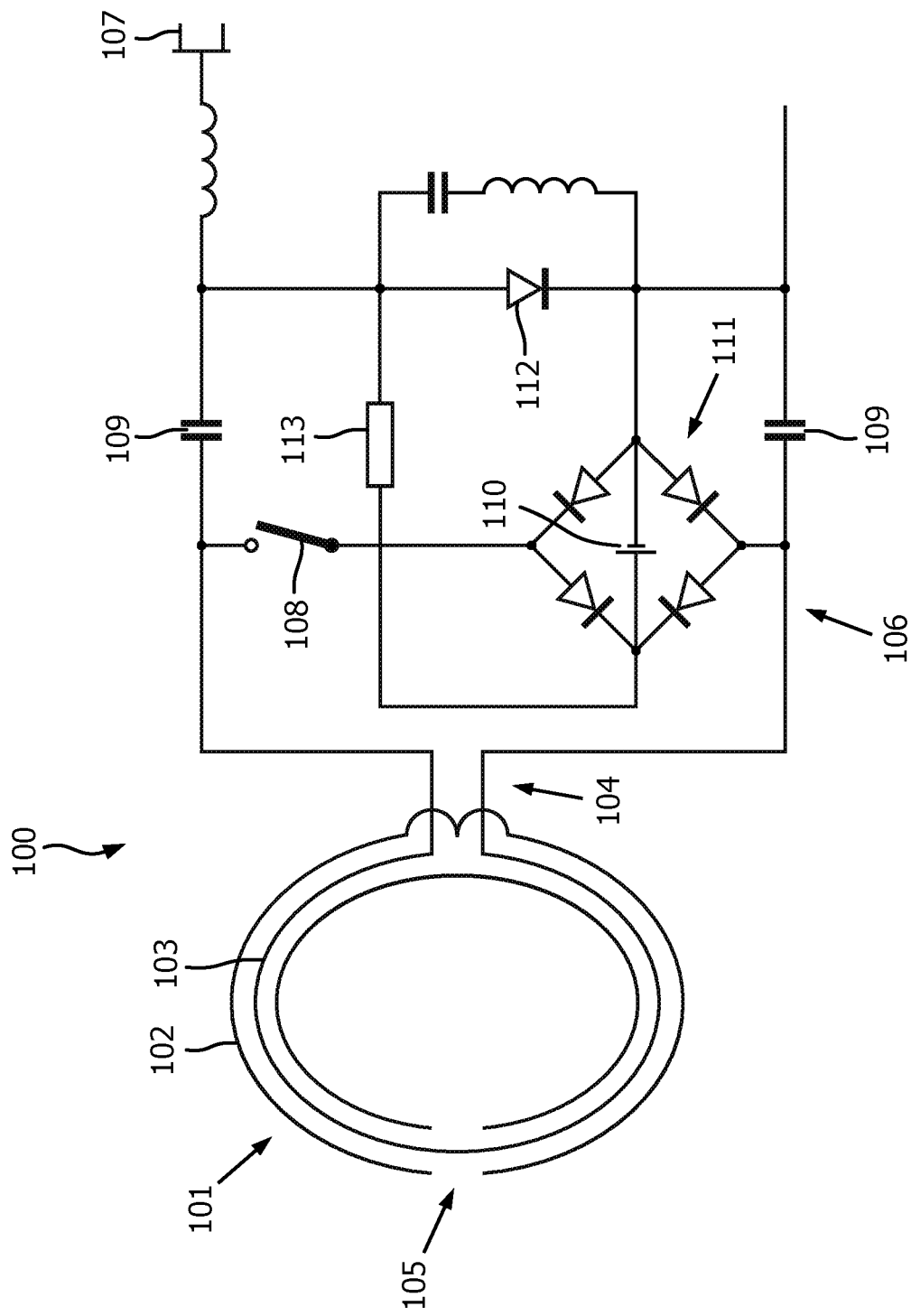
FIG. 1 schematically depicts an embodiment of the disclosed radio frequency receive coil 100 including a resonator 101 with an energy harvesting circuit 106 for use in a magnetic resonance imaging system.

FIG. 1 illustrates one possible embodiment of a radio frequency receive coil 100 including a resonator 101 with an energy harvesting circuit 106 for use in a magnetic resonance imaging system.

The radio frequency receive coil 100 comprises a resonator 101 for receiving radio frequency signals emitted by nuclei in a magnetic resonance examination by a subject under examination. The resonator 101 comprises two conducting elements 102, 103 that are insulated from each other. The first conducting element 102 of the resonator 101 has a conductive loop and forms part of an radio frequency receiver coil 100 that is tuned to at least one first resonance frequency. The resonator 101 can be made resonant by choosing the correct length of the first conducting element 102 and the second conducting element 103. The resonator 101 is further tuned by adjusting the relative permittivity of the substrate, and the ratio between the first conducting element 102 diameter and the second conducting element 103 diameter. The second conducting element 103 of the resonator 101 has a conductive loop with a pair of ends 104, wherein the second conducting element 103 of the resonator 101 is configured to form an electric circuit electrically insulated from and reactively coupled to the primary resonant circuit, the electric circuit is adapted to detune the primary resonant circuit to at least one second resonance frequency. The electric circuit has in principle the function of a switching circuit capable of tuning radio frequency coils of various configurations. Furthermore, the electric circuit provides the function of energy harvesting and coupling of a MRI signal to the following RF-chain with simultaneously noise matching of the receiving loop to the preamplifier 107.

With reference to FIG. 1, one possible embodiment of the radio frequency receive coil 100 is that the resonator 101 is a transmission cable e.g. a coax cable. The coaxial cable is made up of at least one inner core conductor 103 surrounded by a sheath or shield conductor 102, wherein the shield conductor 102 of the coax cable forms the first conducting element 102 and the inner core conductor 103 forms the second conducting element 103. The two conductors are electrically insulated from each other, and together form the radio frequency receive coil 100.

Furthermore, a gap 105 can be foreseen in the shield conductor 102 of the coaxial cable. The current on the inner core conductor 103 increases approximately linearly from zero at the pair of ends 104 to a maximum at the gap 105 of the shield conductor 102, which is mirrored by an opposing current distribution on the inner surface of the shield conductor 102. At the gap of the shield conductor 102 skin depth effects allow a current to flow through the gap onto the outer surface of the shield conductor 102, and this current travels uniformly towards the other edge of the gap 105.

Detuning of a radio frequency coil refers to the practice of shifting the resonance frequency of a primary resonant circuit to one or more other frequencies different from the original resonance frequency. A radio frequency receive coil is commonly detuned when a radio frequency transmitter coil is active or operational, i.e., when the system is transmitting radio frequency excitation pulses to a subject under examination. The radio frequency receive coil 100 is part of a radio frequency receiver further comprising a wireless transceiver. The radio frequency receive coil 100 receives magnetic resonance signals from the examination zone.

A preamplifier 107 is connected in series with one of the ends 104 of the second conducting element. The connection of the preamplifier 107, shown by a FET in FIG. 1, is made series resonant such that a low impedance is connected, which is spoiling the loop resonance. The signals from the preamplifier 107 may be transformed into digital signals and/or wirelessly transmitted to a transceiver unit remote from the examination zone by the wireless transceiver.

To provide electric power for the radio frequency receiver, the radio frequency receive coil 100 further comprises an energy harvesting circuit 106 and a rechargeable power source 110. The energy harvesting circuit 106 is electrically coupled in parallel over the pair of ends 104 of the second conducting element 103. The energy harvesting circuit 106 can be connected to the second conducting element 103 by a switch 108, wherein the switch is activated during the transmit phases of the MRI sequence. The switch 108 can be e.g. an active switch controlled by the MRI system or a passive switch activated by the transmit pulse of the MRI excitation pulses. A rechargeable power source 110, such as a rechargeable battery or a capacitor, is charged by the harvested electric power. The rechargeable power source 110 is used to power the radio frequency receiver and the wireless transceiver.

The energy harvesting circuit 106 further comprises a rectifier 111 to generate a direct current for use as a source of power and to charge the rechargeable power source 110. As long as the rectifier 111 charges the rechargeable power source 110, the energy harvesting circuit 106 forms a low impedance circuit over the pair of ends 104 of the second conducting element 103. When the rechargeable power source 110 is almost fully charged, the charging current will be significantly reduced, which means, that the pair of ends 104 of the second conducting element 103 are not terminated by a low impedance anymore. As soon as the rechargeable power source 110 is charged to a sufficient voltage, a current flows e.g. via a resistor 113 to a switching component 112 which generates a low impedance for maintaining the detuning. The switching component 112 can be e.g. a pin-diode, which might also be combined with a Zener-diode. The switching component 112 is activated to ensure efficient detuning during the transmit phase in case of a high loading state of the rechargeable power source 110. A second switch might be used for disconnecting that path during reception.

Figure 2:
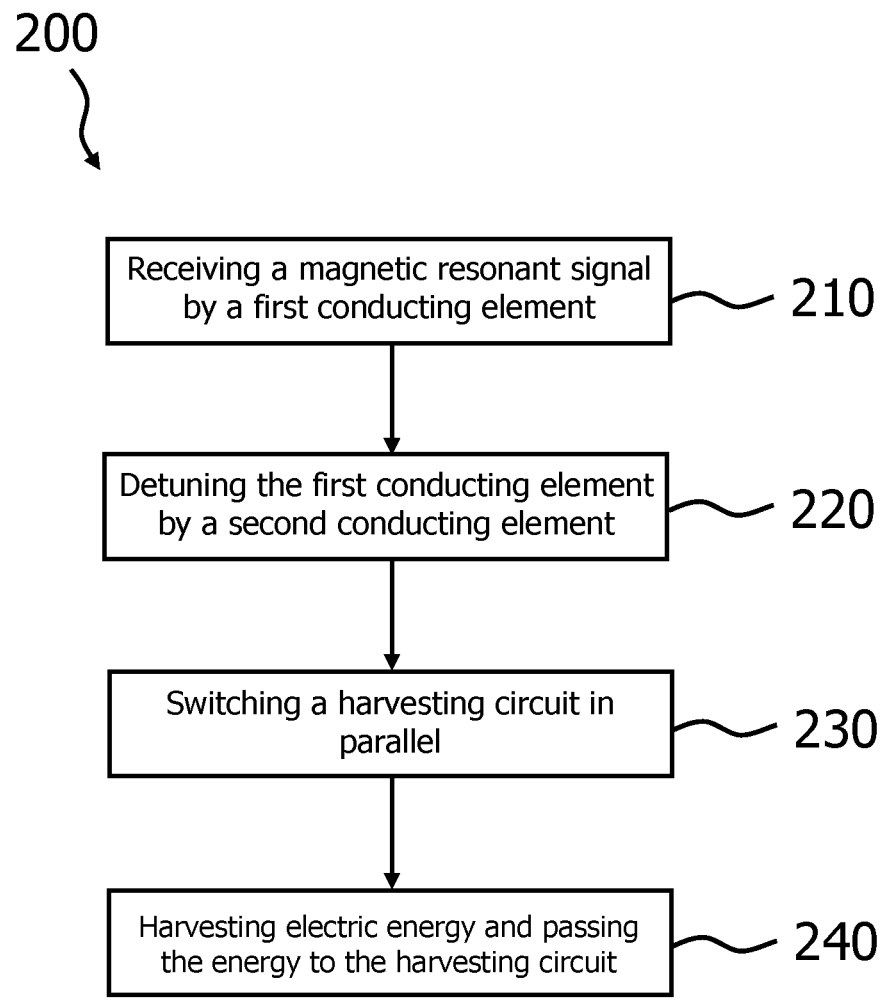
FIG. 2 illustrates a flow chart 200 of a method for harvesting energy according to one embodiment of the present invention.

FIG. 2 illustrates a flow chart of a method for harvesting energy according to one embodiment of the present invention. FIG. 2 is described in combination with FIG. 1.

At step 210 a magnetic resonant signal of a magnetic resonant examination is received by a first conducting element 102 of the resonator 101. The first conducting element 102 has a conductive loop wherein the received signal is induced in that loop. The first conducting element 102 is configured to form a primary resonant circuit tunable to at least one first resonance frequency.

At step 220, the first conducting element 102 is detuned by a second conducting element 103 of the resonator 101. The second conducting element 103 forms an electric circuit electrically insulated from and reactively coupled to the primary resonant circuit 102. The electric circuit is adapted to detune the primary resonant circuit to at least one second resonance frequency. The second conducting element 103 of the resonator 101 has a conductive loop with a pair of ends 104.

At step 230, a harvesting circuit 106 is switched in parallel at the pair of ends 104 of the second conducting element 103. The harvesting circuit 106 is switched in parallel by a switch 108.

At step 240, electric energy from the first conducting element 102 is harvested by inducing electric energy from the first conducting element 102 to the second conducting element 103. The harvesting current is passed to the harvesting circuit 106 by the second conducting element 103. The rectifier 111 of the harvesting circuit 106 generates a direct current for use as a source of power and to charge the rechargeable power source 110.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope. Further, for the sake of clearness, not all elements in the drawings may have been supplied with reference signs.

| REFERENCE SYMBOL LIST | |
|---|---|
| RF receive coil arrangement | 100 |
| resonator | 101 |
| first conducting element | 102 |
| second conducting element | 103 |
| pair of ends | 104 |
| gap in the first conducting element | 105 |
| harvesting circuit | 106 |
| preamplifier | 107 |
| electrical switch | 108 |
| capacitor | 109 |
| rechargeable power source | 110 |
| rectifier | 111 |
| pin-diode | 112 |
| resistor | 113 |

The invention claimed is:

1. A radio frequency receive coil including a resonator for use in a magnetic resonance imaging system, the receive coil comprising:
   a first conducting element of the resonator having a conductive loop wherein the received signal is induced in that loop, configured to form a primary resonant circuit tunable to at least one first resonance frequency;
   a second conducting element of the resonator configured to form an electric circuit electrically insulated from, and reactively coupled to, the primary resonant circuit, the electric circuit adapted to detune the primary resonant circuit to at least one second resonance frequency;
   the second conducting element of the resonator having a conductive loop with a pair of ends connected to a preamplifier;

an energy harvesting circuit electrically coupled in parallel over the pair of ends of the second conducting element, wherein the energy harvesting circuit is adapted for being connected to the second conducting element during transmission by a switch;

a rechargeable power source coupled to the energy harvesting circuit, wherein the rechargeable power source is adapted for being charged by the energy harvesting circuit, and a switching component comprising a pin-diode circuited in parallel to the energy harvesting circuit, wherein the pin-diode is adapted to redirect a current as soon as the rechargeable power source is charged to a sufficient voltage.

2. The radio frequency receive coil according to claim 1, wherein the energy harvesting circuit further comprises a rectifier, wherein the rectifier is adapted to charge the rechargeable power source.

3. The radio frequency receive coil according to claim 1 wherein the resonator is a transmission cable.

4. The radio frequency receive coil according to claim 3 wherein the transmission cable is a coaxial cable.

5. The radio frequency receive coil according to claim 4 wherein the first conducting element is an outer shield of the coaxial cable, and the second conducting element is an inner core of the coaxial cable.

6. The radio frequency receive coil according to claim 3 wherein the resonator consists of two or more transmission cables.

7. A method for energy harvesting by a radio frequency receive coil for use in a magnetic resonance imaging system including a resonator and an energy harvesting circuit as claimed in claim 1.

8. The energy harvesting method of claim 7, further comprising:
    charging a rechargeable power source by the induced harvesting current with a rectifier.

9. A magnetic resonance system comprising a radio frequency receive coil according to claim 1.

10. A non-transitory computer readable medium storing instructions that, when executed on a magnetic resonance imaging (MRI) system including a radio frequency receive coil including a resonator, causes the MRI system to perform a method for harvesting energy on the MRI system, the method including:
    receiving a magnetic resonance signal of a magnetic resonance examination by a first conducting element of the resonator having a conductive loop, wherein the received signal is induced in that loop, wherein the first conducting element is configured to form a primary resonant circuit tunable to at least one first resonance frequency;
    detune the primary resonant circuit by a second conducting element of the resonator, wherein the second conducting element is configured to form an electric circuit electrically insulated from, and reactively coupled to, the primary resonant circuit, the electric circuit adapted to detune the primary resonant circuit to at least one second resonance frequency, wherein the second conducting element of the resonator has a conductive loop with a pair of ends;
    switching a harvesting circuit in parallel at the pair of ends of the second conducting element, wherein the harvesting circuit is adapted for being connected to the second conducting element during transmission by a switch;
    harvesting electric energy from the first conducting element by inducing the harvesting current from the first conducting element to the second conducting element, and
    passing the harvesting current to the harvesting circuit by the second conducting element.

11. The non-transitory computer readable medium of claim 10, wherein the method further includes:
    charging a rechargeable power source with the harvesting current with a rectifier.

12. The non-transitory computer readable medium of claim 11, wherein passing the harvesting current to the harvesting circuit by the second conducting element further includes:
    passing the harvesting current to the harvesting circuit by the second conducting element with a switching component comprising a pin-diode circuited in parallel to the harvesting circuit, wherein the pin-diode is adapted to redirect the current as soon as the rechargeable power source is charged to a sufficient voltage.

* * * * *